United States Patent [19]

Kinoshita et al.

[11] Patent Number: 4,581,652

[45] Date of Patent: Apr. 8, 1986

[54] CHARGE TRANSFER DEVICE

[75] Inventors: Takao Kinoshita, Tokyo; Akihiko Tojo, Yokohama; Akira Suga, Tokyo, all of Japan

[73] Assignee: Canon Kabushiki Kaisha, Tokyo, Japan

[21] Appl. No.: 546,921

[22] Filed: Oct. 31, 1983

[30] Foreign Application Priority Data

Nov. 6, 1982 [JP] Japan .......................... 57-195056

[51] Int. Cl.⁴ ........................................ H04N 3/14

[52] U.S. Cl. ........................................ 358/213

[58] Field of Search .................... 358/213, 41, 209; 357/24 LR; 250/578; 377/57

[56] References Cited

U.S. PATENT DOCUMENTS

| | | | |
|---|---|---|---|
| 3,955,100 | 5/1976 | Takahashi et al. | 377/57 |
| 4,223,233 | 9/1980 | Cappon et al. | 377/57 |
| 4,263,623 | 4/1981 | Woo et al. | 358/213 |
| 4,486,783 | 12/1984 | Tanaka et al. | 358/213 |
| 4,499,496 | 2/1985 | Tanaka et al. | 358/213 |

*Primary Examiner*—Gene Z. Rubinson
*Assistant Examiner*—Stephen Brinich
*Attorney, Agent, or Firm*—Fitzpatrick, Cella, Harper & Scinto

[57] ABSTRACT

A charge transfer device has a shift register, wherein the shift register comprises converting section for converting an input signal from the outside into charges; a transfer section for transferring said charges; and an input gate section for transferring the charges obtained in this converting section to the transfer section. The level difference gradient of the potentials in the input gate section is formed in the direction opposite to the level difference gradient of the potentials in the transfer section.

15 Claims, 7 Drawing Figures

CHARGE TRANSFER DEVICE

BACKGROUND OF THE INVENTION

1. Field of the Invention

The present invention relates to a charge transfer device having a shift register.

2. Background of the Invention

There have been proposed so far various apparatuses using the image pickup function and analog memory function possessed by charge transfer devices. For example, in U.S. Pat. No. 4,263,623, an apparatus is proposed in which a charge transfer device is used as an image pickup device and a horizontal shift register provided with a charge injecting section is used as a memory.

Such an apparatus has a drawback in that if the signal to be input to the horizontal shift register does not have good linearity, the S/N ratio will deteriorate when the signal circulates many times in a circuit. In addition, although a delay line or the like using a CCD is known generally, a large problem on linearity of the input signal also occurs similarly. This is because, in conventional CCDs, when the input signal is input into the CCD with a predetermined periodic timing, unnecessary charges would have been mixed in the CCD even in the non-input timing.

SUMMARY OF THE INVENTION

It is an object of the present invention to provide a charge transfer device having such a charge injecting section in which charges can be input with high linearity.

To accomplish such an object, a charge transfer device of an embodiment according to the present invention is constituted in such a manner that the level difference gradient of the potentials in an input gate section is opposite to the direction of the level difference gradient of the potentials in the transfer section, thereby enabling the charges to be input with high linearity. Furthermore, in the embodiment of the present invention, the construction of the input gate section and the transfer section can be simplified since the directions of the level differences gradient of the potentials are merely opposite to each other, so that its manufacture also becomes easy.

Other objects, features, and effects of the present invention will become apparent from the following detailed description taken in conjunction with the accompanying drawings.

DETAILED DESCRIPTION OF THE PREFERRED EMBODIMENTS

An embodiment of the present invention will be described herein below with reference to the drawings.

Figure 1:
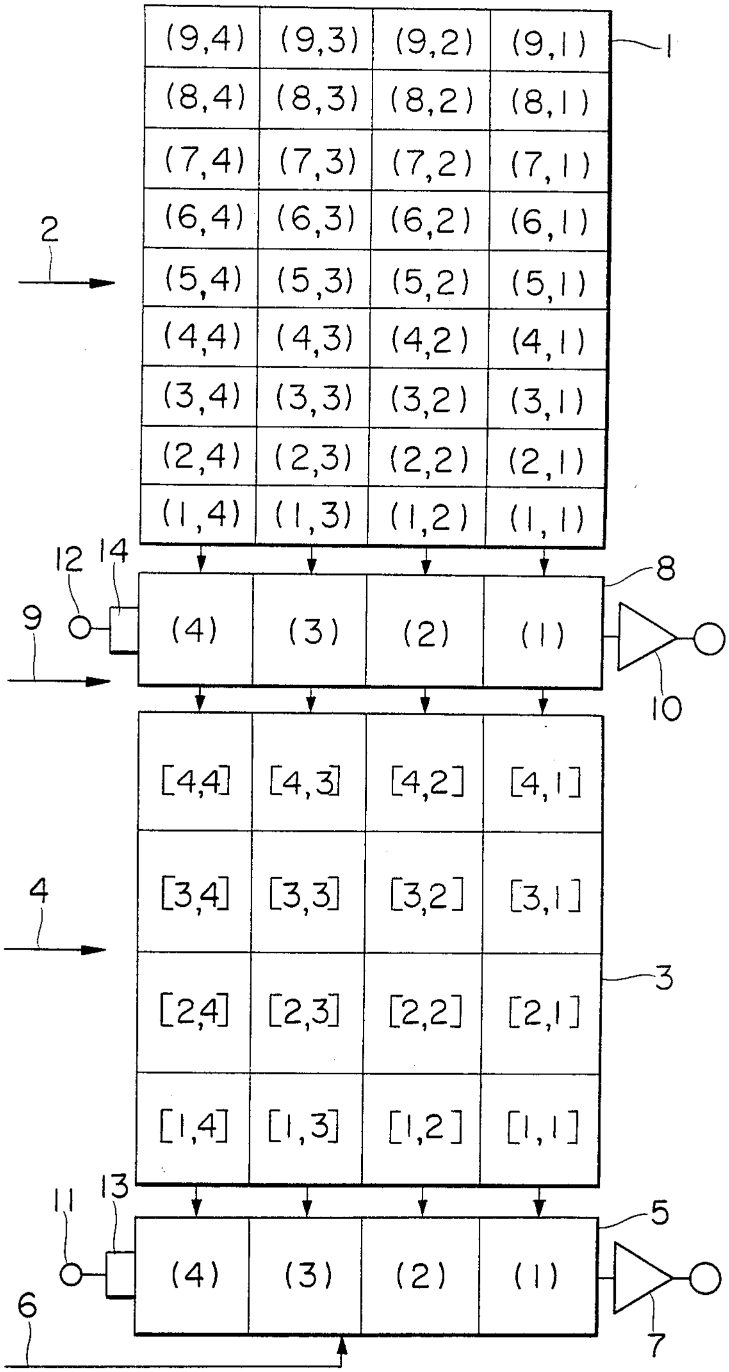
FIG. 1 is a diagram illustrating the arrangement of a CCD of an embodiment of the present invention.

FIG. 1 is a diagram illustrating the arrangement of a CCD of the frame transfer type to which the present invention can be applied.

In FIG. 1, a reference numeral 1 denotes an image pickup array of the frame transfer type CCD. For example, in the NTSC system, the number of cells in the vertical direction of this image pickup array is set to about 490, which is almost equal to the number of scanning lines. That is, it has the number of cells which is about twice the number of cells in a conventional frame transfer type CCD. The number of cells in the horizontal direction is generally selected to be 390, or about 570 or about 770, which is the number corresponding to the color subcarrier frequency. Referring to FIG. 1, only nine cells in the vertical direction and only four cells in the horizontal direction among them are shown, respectively, for simplicity. A numeral 2 indicates an electrode to apply an voltage for photoreception and transfer of charges to this image pickup array.

A numeral 3 represents an accumulation array, in which the number of cells in the vertical direction is about one-half of the number of cells of the image pickup array 1.

A numeral 4 indicates an electrode to apply a voltage for transferring the charges in the same manner as the image pickup array.

A numeral 5 shows a horizontal shift register which is constituted by an array of charge transfer sections consisting of the number of cells which is almost equal to the number of horizontal cells of the image pickup array and accumulation array.

A numeral 6 indicates an electrode to apply a voltage for transferring the charges in this horizontal shift register 5.

A numeral 7 is an amplifier for converting the charges transferred from the horizontal shift register 5 into the voltage output.

The arrangement as described above is not so different from a conventional one except that the number of cells in the vertical direction of the image pickup array is twice the number of cells of a conventional area sensor of the frame transfer type. The point which largely differs from prior devices is that the device of the present invention has a first horizontal shift register 8 for reading out the charges, which register is substantially identical to the second horizontal shift register 5, between the image pickup array 1 and the accumulation array 3. A numeral 9 denotes an electrode to apply a voltage for transferring the charges in this first horizontal shift register, and 10 represents an amplifier to convert the transferred charges into the voltage and read out, respectively. Numerals 11 and 12 are analog signal input terminals to the horizontal registers 5 and 8, respectively. The external signal voltages applied to the above-mentioned input terminals are input as charge signals to the horizontal registers by voltage-charge converting sections 13 and 14 which will be described later in FIG. 5. At this time, it is assumed that proper driving clocks are applied from the clock terminals 6 and 9 to the above horizontal registers. In the case where no signal is input, the horizontal registers are shut off from the external input signal in response to the gate signal.

As a method of transferring charges, various methods such as single-phase drive, two-phase drive, three-phase drive, and four-phase drive methods, or the like are generally known. Any of these methods can be applied to the CCD arrangement of the present invention. The arrangement consisting of the image pickup array 1, first horizontal shift register 8 and accumulation array 3 will be described hereinbelow with reference to FIG. 2 with respect to the single-phase drive method as an example for simplicity of the explanation.

The single-phase drive method to be used here may be the same as that disclosed in U.S. Pat. No. 4,229,752 or the like, and its detailed operation will be described later.

Figure 2:
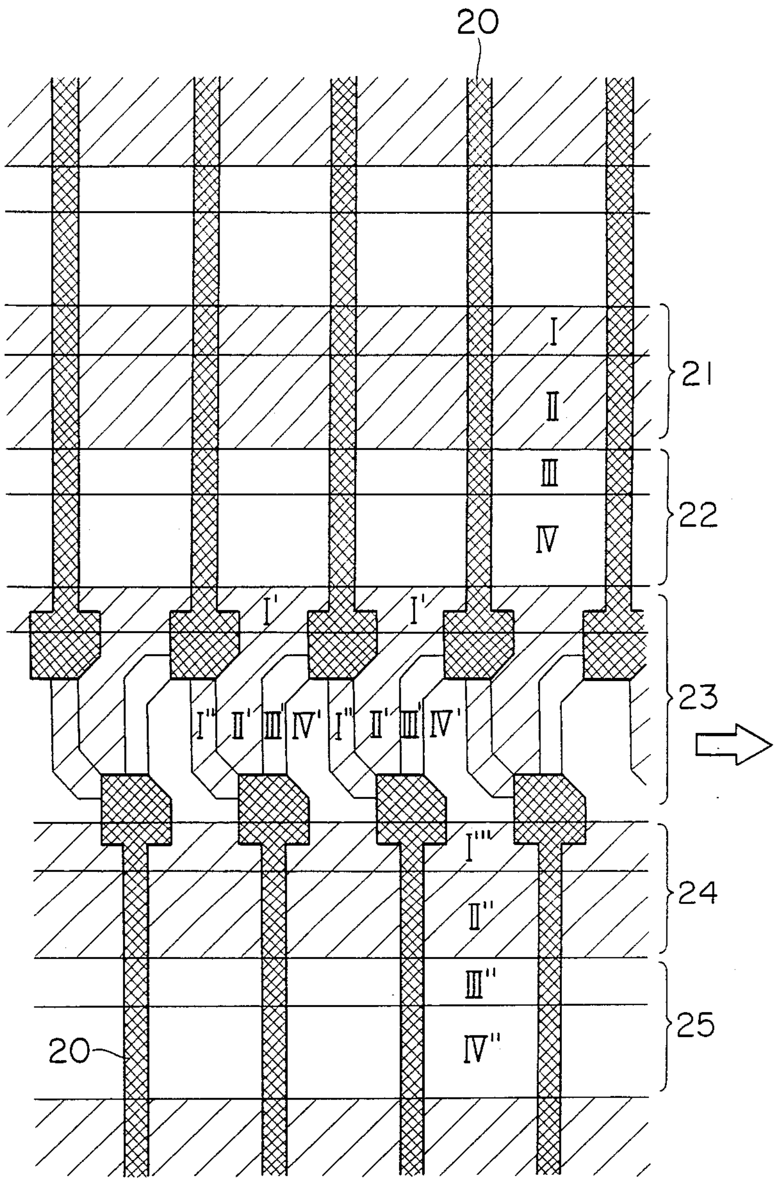
FIG. 2 is a diagram illustrating the arrangement of portion of the CCD of FIG. 1.

Referring to FIG. 2, a reference numeral 20 denotes a channel stop to prevent the charge leakage between the cells in the horizontal direction, which channel stop consists of a P+-type semiconductor which was diffused in the P-type silicon substrate. A numeral 21 indicates a polysilicon electrode of the image pickup array, this electrode 21 is evaporated on the above-mentioned substrate through an insulating layer. Regions I and II whose potential level states are different are formed in the P-type silicon substrate under this electrode 21 by the ion implantation or the like. Numeral 22 is a region where a virtual electrode is formed in the silicon substrate, and regions III and IV whose potential states are different are also formed in the above-mentioned silicon substrate under this region similarly by the ion implantation or the like.

One cell is constituted by these regions I to IV in the vertical direction.

Numeral 23 represents a first horizontal shift register region. In this region 23, the polysilicon electrode corresponding to the hatched section is formed like comb teeth, and regions I' and II' whose potential states are different are divided and formed by the ion implantation or the like under this polysilicon electrode. Although the potential levels of the regions I' and II' are identical here, respectively, those regions are isolated by the channel stop 20. The potentials of the regions III' and IV' are set to be identical to those of the regions III and IV of the virtual electorde section 22 of the image pickup array, respectively.

Regions numbered at 24 and 25 are constituted in the manner similar to those of the image pickup arrays 21 and 22, respectively.

Figure 3:
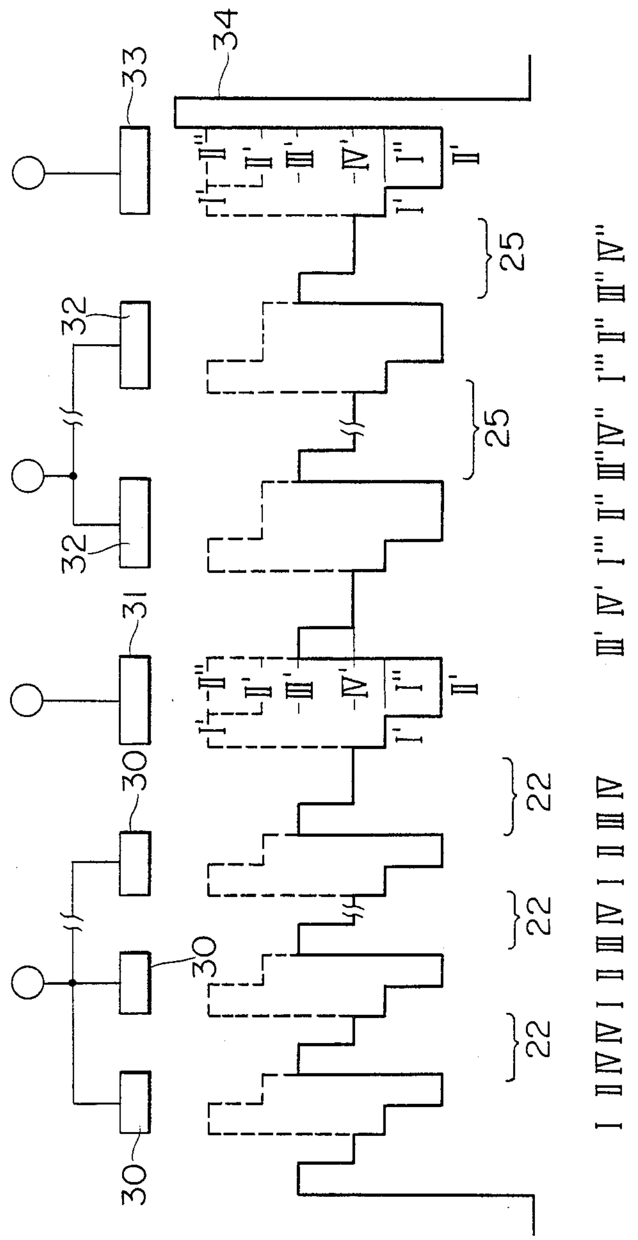
FIG. 3 is a diagram showing the states of the potentials of the, CCD of FIG. 1.

FIG. 3 is a schematic diagram showing the potential states for the electrons in the substrate of the CCD shown in FIG. 2.

In FIG. 3, numeral 30 indicates a polysilicon electrode of the image pickup array which corresponds to the electrode 21 of FIG. 2. All of the polysilicon electrodes of the image pickup array are commonly connected and to which voltages for transferring the charges are applied. The section under this polysilicon electrode 30 is divided in the regions I and II in the same manner as described with respect to FIG. 2, wherein the potential level for the electrons of the region I is higher than that of the region II.

In FIG. 3, the broken lines show the state in that the polysilicon electrode 30 is at the low potential level, while the solid lines indicate the state in that the polysilicon electrode 30 is at the high potential level, respectively.

The potential level for the electrons in the region III of the virtual electrode section 22 of FIG. 2 is slightly higher than that in the region IV as shown in FIG. 3. The potential level of this section does not vary in dependence upon the voltage to be applied to the electrode 30 but is always maintained to be constant. Therefore, when a constant voltage is applied to the polysilicon electrode, the charges are accumulated and when a pulse-like voltage is applied thereto, the charges are transferred.

A reference numeral 31 denotes a polysilicon electrode of the first horizontal shift register. This electrode is separated from the other electrodes and to which an independent voltage is applied. The internal potentials of this horizontal shift register section are as shown in the diagram below the polysilicon electrode 31 of FIG. 3, respectively.

If the potential levels to be applied to electrodes 30–33 are equal, the potential levels of the regions I, I', I'' and I''' will be equal. In this case, the potential levels of the regions II, II' and II'' are also equal. The potential levels of the regions III, III' and III'' are always equal and the potential levels of the region IV, IV' and IV'' are also always equal.

In FIG. 3, numeral 32 indicates a polysilicon electrode of the accumulation array. The internal potentials of this accumulation array are similar to those of the image pickup array. Numeral 33 in FIG. 3 represents a second horizontal shift register (numbered at 5 in FIG. 1). The arrangement of this register 33 is similar to that of the first horizontal shift register except that the one side is closed by a channel stop 34.

Numeral 34 in FIG. 3 denotes the potential states of the channel stop section. The function of charges in the first horizontal shift register section will be described hereinbelow.

By applying the low-level voltage to the polysilicon electrode 30, the potentials of the regions I and II rise as shown by the broken lines of FIG. 3, and the charges accumulated in the region II of the image pickup array are transferred through the next region III on the right side of FIG. 3 and enter the region IV of the potential well 22 of FIG. 3. At this time when the high-level voltage is applied to the polysilicon electrode 31 of the first horizontal shift register, the potentials of the regions I, II'' and II' become the states indicated by the solid lines of FIG. 3, so that the charges in the region IV are transferred through the regions I and I'' to the region II'. When the low-level voltage is then applied to this electrode 31, each potential of the regions I' and II' becomes the state indicated by the broken lines, so that the charges accumulated in the II' region are transferred through the region III' to the region IV'. At this time when the high-level voltage is applied to the polysilicon electrode 32 of the accumulation array, the potentials of the regions I''' and II'' fall as shown by the solid lines, causing the charges accumulated in the region IV' to be transferred through the region I''' to the region II'.

As described above the charges transferred to the region II'' of the accumulation array are transferred through the region III' to the region IV'' since the potentials of the regions I''' and II'' change as shown by the broken lines by applying the low-level voltage to the polysilicon electrode 32 of the accumulation array. Consequently, by applying the pulse voltage as a drive signal to the electrode 32, the accumulated charges are sequentially transferred in the order of II''→IV''→II'' and are transferred to the second horizontal shift register 5, then the charges are read out to the outside through the second horizontal shift register. The flow of the charges described in the above is substantially the same as that of a conventional frame transfer type CCD without the first horizontal shift register.

The flow of the charges in the case where the signal is read out to the outside through the first horizontal shift register will now be described.

In this way, the charges transferred to the region IV' are transferred to the accumulation array by applying the high-level voltage to the polysilicon electrode 32 of the accumulation array in the above-described operation. On the other hand, the low-level voltage is applied to this electrode 32 to keep the potentials of the regions I''' and II'' to be as shown by the broken lines, while in this state the pulse-like voltage is applied to the first horizontal shift register 31 for allowing the potentials of the regions I' and II' to be alternately shifted to the states as indicated by the solid lines and broken lines, thereby causing the charges in the region IV' to be transferred to the regions in the sequence of I''→II'→III'→IV' in the horizontal direction to the right in FIG. 1. Thus, the readout operation of the signal to the outside is executed through the amplifier 10.

The operation when the device of the present invention is operated in an actual camera will now be described with reference to FIG. 4.

Figure 4A:
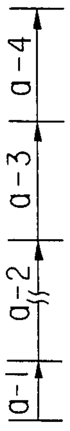
FIGS. 4(*a*) and (*b*) are charts showing the sequences to describe the operation of the CCD of FIG. 1.
Figure 4B:
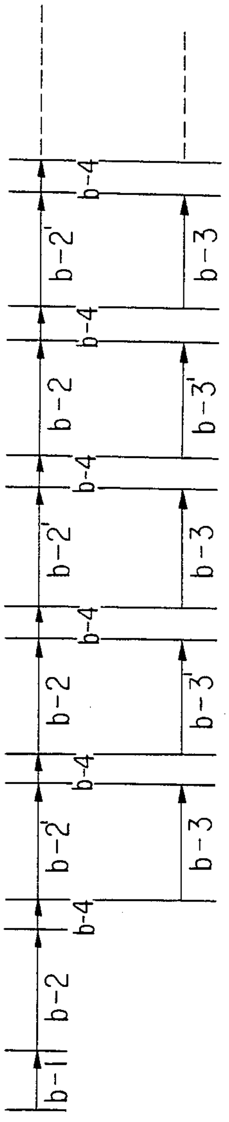

FIG. 4(*a*) is a chart indicating the operating states when the device of the present invention is made operative as a video still camera, and FIG. 4(*b*) is a chart representing the operating states when it is made operative as a conventional video camera, respectively.

The operation will be first described whereby the device is operated as a video still camera.

The period (a-1) of FIG. 4(*a*) denotes the state of all clear; i.e. in this period, the charges accumulated by the dark current or the like are cleared through the anti-blooming drain immediately before the exposing operation, or the charges are cleared by draining them to the outside by making the CCD operative at a high speed.

The next period (a-2) indicates the image accumulating period in the image pickup array 1; in this period, the substantial exposure time may be limited by means of a shutter or the like.

The period (a-3) is the readout period of the first field; in this period, the first field signal consisting of the charge information of, e.g. the lines bearing odd numbers among the charge information accumulated in the accumulation array 3 is read out. In other words, the signal of one line among the signals accumulated in each cell of the image pickup array 1 shown in FIG. 1 is vertically transferred in the horizontal blanking period of the standard television cycle, thereby storing the signal of the first line, i.e. the data of (1, 1) to (1, 4) in the first horizontal shift register 8. Then, by driving the register 8 to horizontally transfer, this data of one line is read out through the amplifier 10 in one horizontal scanning period. Next, the data of each cell of two lines of the image pickup array 1 is vertically transferred in the next horizontal blanking period. At the same time, the register 8 and the accumulation array 3 are also driven synchronously. Thus, the data of (2, 1)–(2, 4) is stored in the uppermost line of the accumulation array 3 and the data of (3, 1)–(3, 4) is stored in the register 8. The data in this register 8 is read out through the amplifier 10 in the same manner as explained before in the next horizontal scanning period.

In like manner as above, the image pickup array 1, register 8 and accumulation array 3 are driven to vertically transfer two lines at a time in every horizontal blanking period, and the register 8 is driven to horizontally transfer in the horizontal scanning period, thereby enabling the first field signal consisting of only the charge information of the lines bearing odd numbers among the charges accumulated in the period (a-2) of FIG. 4 to be read out in the period (a-3) in one vertical period.

In this way, since the second field signal consisting of the charge information of the lines bearing even numbers is accumulated in the accumulation array 3 during the period when the first field is read out, by reading out this signal of the accumulation array 3 by the second horizontal shift register 5 in the next period (a-4), the signals of the second field are sequentially read out.

Namely, by driving one line of the accumulation array 3 to vertically transfer in the horizontal blanking period, the data of (1, 1)–(1, 4) is stored in the horizontal shift register 5 in the period (a-3) which substantially corresponds to the vertical period.

This register 5 is driven to horizontally transfer in the next horizontal scanning period, thereby reading out this data through the amplifier 7.

In the same way as described above, the data is vertically transferred on the line-by-line basis in every horizontal blanking period, and by reading out this data by the horizontal shift register 5 in the next horizontal period, the second field is read out in the period (a-4).

The first and second fields provide the image information which was simultaneously formed and there is the interlaced relation between them; therefore, they are suitable for reproduction by a video monitor of the standard television system. In addition, no position shift between field images will be caused.

The operating method will now be described whereby this device is operated in the movie mode in a standard video camera with reference to FIG. 4(*b*).

The period (b-1) of FIG. 4(*b*) corresponds to the operational period (a-1) of FIG. 4(*a*). However, this operation is not always necessary.

(b-2), (b-2'), . . . indicate the accumulating periods of the first and second fields, respectively. That is to say, the charges (in the first field) accumulated in the period (b-2) are read out in the period (b-3) and the charges (in the second field) accumulated in the period (b-2') are read out in the period (b-3'), respectively.

The period (b-4) denotes the period when the charges accumulated in the image pickup array are transferred to the accumulation array.

For the frame transfer type CCD according to the present invention, the number of cells in the vertical direction of the image pickup array is 490 and the number of cells in the vertical direction of the accumulation array is 245; therefore, the operation when transferring the charges from the image pickup array to the accumulation array and the interlacing method of the CCD of the present invention are different from those of an ordinary frame transfer type CCD. This operation of the CCD of the present invention will be described with reference to FIG. 1.

After the exposure and accumulation were first performed in the period (b-2), the charges accumulated in the image pickup array are transferred to the accumulation array in the period (b-4). In this transferring operation, the charges accumulated in (1, 1), (1, 2), (1, 3) and (1, 4) are first transferred through the first horizontal register 8 to (4, 1), (4, 2), (4, 3) and (4, 4) of the accumulation array 3. Then, the charges in (2, 1), (2, 2) (2, 3) and (2, 4) are similarly transferred to (4, 1), (4, 2), (4, 3)

and and (4, 4). At this time the pulse voltage for vertical transfer is not applied to the accumulation array to permit the charges accumulated in (1, 1)–(1, 4) upon exposure to be held in (4, 1)–(4, 4). Consequently, the charges accumulated in the two lines of (1, 1)–(1, 4) and (2, 1)–(2, 4) of the image pickup array are added to (4, 1)–(4, 4).

The charges of one line of the accumulation array are then transferred, i.e. the charges added in (4, 1)–(4, 4) are transferred to (3, 1)–(3, 4); in the same manner as above, the charges of two lines, i.e. (3, 1)–(3, 4) and (4, 1)–(4, 4) of the image pickup array are again transferred to (4, 1)–(4, 4) and are added. Thereafter, in the same manner as described above, the operation to transfer the charges of one line of the accumulation array and the operation to transfer and add the charges of two lines of the image pickup array to (4, 1)–(4, 4) are repeated, so that the addition signals of (1, 1)–(1, 4) and (2, 1)–(2, 4) are transferred to (1, 1)–(1, 4) of the accumulation array; the addition signals of (3, 1)–(3, 4) and (4, 1)–(4, 4) to (2, 1)–(2, 4); the addition signals of (5, 1)–(5, 4) and (6, 1)–(6, 4) to (3, 1)–(3, 4); and the addition signals of (7, 1)–(7, 4) and (8, 1)–(8, 4) are transferred to (4, 1)–(4, 4), respectively.

Thereafter, the operation advances to the states in the periods (b-2') and (b-3) for allowing the exposing and accumulating operations to be executed; at the same time, the signals transferred and added to the accumulation array 3 in the manner as described above are sequentially transferred to the horizontal shift register 5 on the line-by-line basis, and the signals transferred to this horizontal shift register 5 are sent out in every horizontal period. In this way, the readout operation of the first field is executed.

In the next period (b-4), the charges accumulated in the image pickup array 1 during the period (b-2') for the readout operation of the first field are transferred to the accumulation array 3. In this case, since this operation is the readout operation of the second field, the cells upon transferring the charges from the image pickup array to the sections of (4, 1)–(4, 4) of the accumulation array are shifted by one line, and then the operation for transferring and adding the charges of two lines of the image pickup array is executed.

In other words, with respect to the second field, the accumulated charges in the sections of (2, 1)–(2, 4) and (3, 1)–(3, 4), the accumulated charges in the sections of (4, 1)–(4, 4) and (5, 1)–(5, 4), and the accumulated charges in the sections of (6, 1)–(6, 4) and (7, 1)–(7, 4) are first transferred and added to (4, 1)–(4, 4), respectively. The charges added in each line of the accumulation array 3 are transferred and accumulated. Thereafter by sending the charges accumulated in the accumulation array 3 by the horizontal register 5 in the period (b-3'), the readout operation of the second field is finished. In this way as described above, when the charges in the cells of two lines of the image pickup array are added, the transferring and adding operation of the field at the first time is shifted by one line from the transferring and adding operation at the second time, thereby enabling the signal which was interlaced with the first-time field to be obtained. As a result, it is possible to perform the interlaced image picturing as an ordinary video camera.

Figure 5:
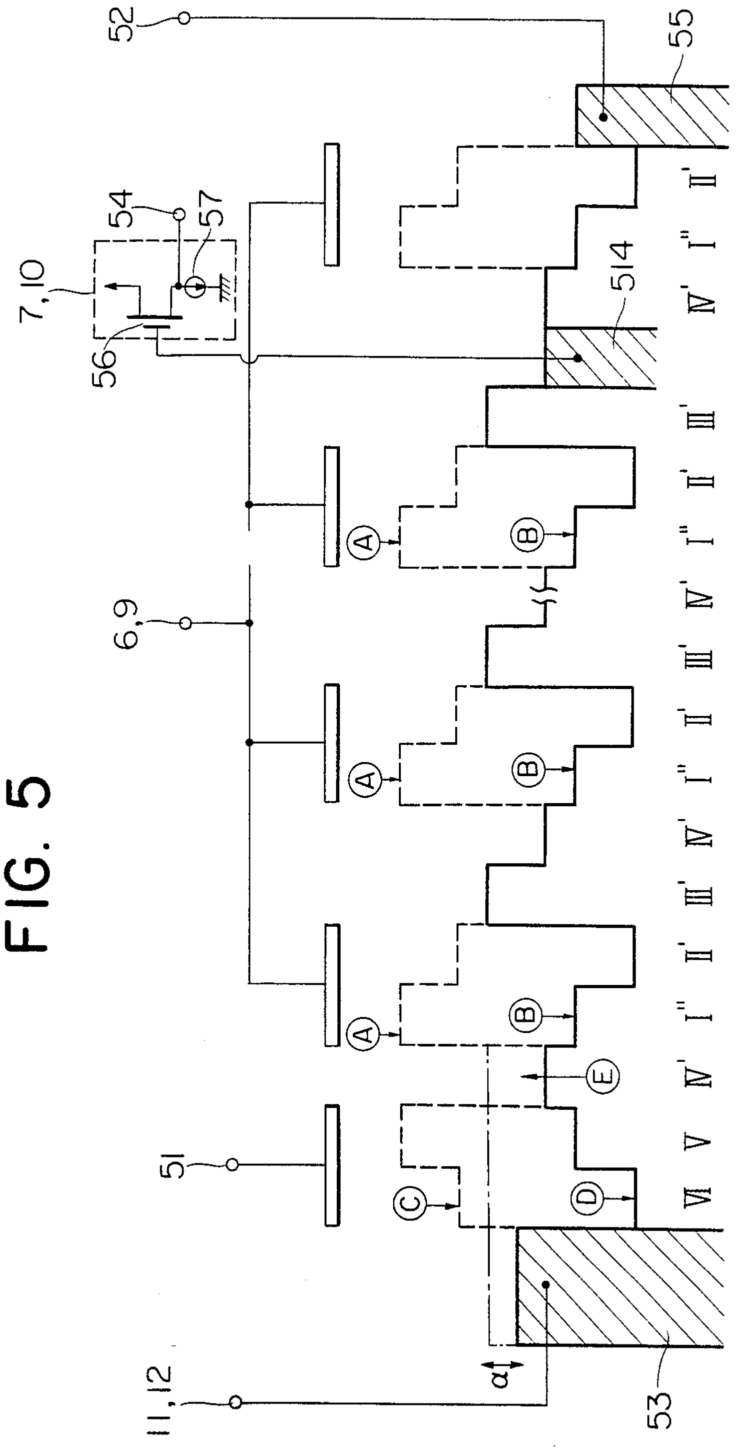
FIG. 5 is a diagram showing the states of the potentials of horizontal shift registers.

FIG. 5 is a schematic diagram showing the internal potential states of the two horizontal shift registers 5 and 8, their voltage-charge converting sections 13 and 14, and charge-voltage coverting sections 7 and 10 shown in FIG. 1.

In FIG. 5, a reference numeral 53 denotes an electrode as signal input means in which phosphorus or the like was diffused with high density, wherein its potential level changes as indicated by an arrow α in response to the input signal voltages to be applied to the signal input terminals 11 and 12. By applying the low-level voltages to the electrodes 6 and 9, the horizontal shift wells become the potential state as indicated by the broken lines Ⓐ. At this time when the high-level voltage is applied to an input gate electrode 51 as input gate means, the potential of the input gate becomes the state indicated by the solid line Ⓓ, so that the gate is opened and this allows the charges to be input into the register. Subsequently when the low-level voltage is applied to the input gate electrode 51, the gate is closed and the potential becomes the stäte indicated by the broken line Ⓒ, causing the charges in dependence upon the voltages to be applied to the input terminals 11 and 12 to be securely held in the region indicated by Ⓔ between the input gate and the horizontal shift well.

When the high-level voltages are then applied to the transfer electrodes 6 and 9, the potentials become the states indicated by the solid lines Ⓑ, so that the charges in the region Ⓔ are transferred through the regions I'' to the regions II'.

When the voltage levels of the transfer electrodes 6 and 9 are further inverted, the potentials become the states indicated by the broken lines Ⓐ, so that the signal charges are transferred through the regions III' to the regions IV'. At this time when the input gate is opened, the electrons are accumulated in the region Ⓔ until its potential becomes the level corresponding to the voltages to be again applied to the signal input terminals 11 and 12.

By repeating the above operations, the external input signals are input as a series of signal charges to the horizontal registers 5 and 8. The input gate is constituted by the regions V and VI as shown in FIG. 5 and is formed in such a manner that the gradient of the potential level difference is opposite to the gradient of the potential level difference of the regions I'' and II' in the horizontal register and that those gradients are almost equal. Due to this, when the input gate is closed and while it is closed, the charges in response to the external signal are not sent to the horizontal shift sections but the residual charges in the regions V and VI are transferred toward the electrode 53. Thus, by closing the input gate, no additional charges are added into the region Ⓔ. In other words, this enables the charges to be input with good linearity. Furthermore, since the potential levels of the regions V, VI and the regions I'', II' are identical, the manufacture of the CCD of the present invention becomes easy.

By applying the transfer pulses, the input signal charges are sequentially transferred to the transfer electrodes 6 and 9 to the right of FIG. 5.

Moreover, the use of these input terminals also enables the transfer efficiency of the horizontal shift registers and accumulation array to be measured.

The charge-voltage converting sections 7 and 10, i.e. output amplifier sections will now be described.

The signal charges transferred are transferred into an already known floating diffusion region 514. This signal charge amount is converted into the voltage by a MOS amplifier 56 and is output from an output terminal 54. A numeral 57 is a constant current load. The above-mentioned signal charges are eliminated by an electrode 55. A positive high voltage is generally applied to the electrode 55 through a terminal 52.

Althrough an example of the two-dimensional charge transfer device of the frame transfer type has been described in the present embodiment, the present invention can be of course applied to a one-dimensional charge transfer device or a two-dimensional transfer device of the interline type, or the like.

Figure 6:
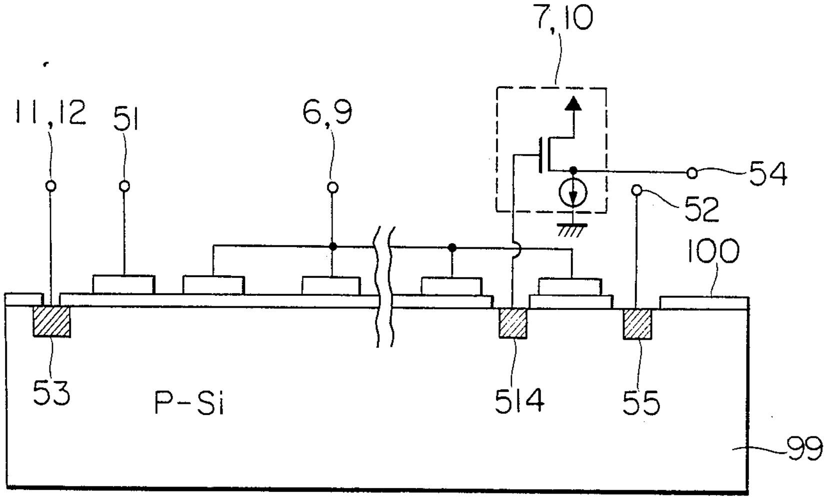
FIG. 6 is a schematic cross sectional diagram of the shift registers shown in FIG. 5.

FIG. 6 is a schematic diagram showing the cross sectional view of the horizontal shift registers shown in FIG. 5. In the drawing, the same elements and components as those shown in FIGS. 1 to 5 are designated by the same reference numerals.

In FIG. 6, a reference numeral 99 indicates a p-type silicon substrate and each section of the image pickup device of the present embodiment is all formed as onchip on this substrate 99. Numeral 53 denotes the n-type semiconductor which forms an input diode as input means for converting the input voltage signals to be applied to the terminals 11 and 12 into the charge information. The input gate electrode 51 and the transfer electrodes 6 and 9 together control the potential level in the substrate 99 through an insulating layer 100. A numeral 514 represents the diffused floating diffusion of the n-type semiconductor. The electrode 55 is also the n-type semiconductor formed by diffusion or the like.

What we claim is:

1. A charge transfer device comprising:

a semiconductor substrate of one conductivity type for charge transfer, said substrate including a first gradient potential section which is preformed in said substrate and has a fixed gradient in a predetermined direction at a predetermined spatial cycle;

an insulating layer on said substrate;

an electrode, provided on said insulating layer, for controlling the potential level in said semiconductor substrate;

signal input means for inputting signal charges to said semiconductor substrate; and gate means for introducing the signal charges to be input by said signal input means to said substrate for charge transfer, said gate means being formed in said substrate and including a second gradient potential section which is preformed in said substrate and has a fixed gradient opposite in inclination polarity to that of said first gradient potential section and a gate electrode for controlling the levels of said potential sections.

2. A charge transfer device according to claim 1, wherein said first gradient potential section consists of a plurality of step-like potential levels.

3. A charge transfer device according to claim 1, wherein said second gradient potential section consists of a plurality of step-like potential levels.

4. A charge transfer device according to claim 1, wherein the directions of the gradients of said first and second gradient potential sections are opposite and those gradient are equal.

5. A charge transfer device comprising:

a charge shift register including a repetition of a first potential gradient which is preformed and has a fixed gradient in a predetermined direction;

input means for converting voltage signals into charges and inputting them to said register; and gate means for allowing the charges from said input means to be input to said register, said gate means having a second potential gradient opposite in inclination polarity to that of said first potential gradient for allowing the residual charges in said gate means to return to the input means when the charges from said input means are not input to said register.

6. A charge transfer device according to claim 5, further including an output amplifier for converting the output charges transferred by said register into voltage signals and outputting them.

7. An image pickup device comprising:

an image pickup array for converting an optical image into an electric signal;

an accumulation array for storing the charge information in said image pickup array;

a first horizontal shift register, provided between said image pickup array and said accumulation array, for selectively and horizontally shifting the charges to be transferred from the image pickup array to the accumulation array and reading them out;

an output amplifier for converting the charge output of said first horizontal shift register into a voltage;

input means for converting a voltage signal into charges and inputting them into said first horizontal shift register;

gate means for allowing the charges from said input means to be input to said first horizontal shift register, said gate means having a potential gradient for allowing the residual charges in said gate means to return to said input means when the charges from said input means are not input to said first horizontal shift register, and a second horizontal shift register for reading out the charges in said accumulation array.

8. An image pickup device according to claim 7, wherein said first horizontal shift register has a fixed gradient opposite in inclination polarity to that of said gate means.

9. An image pickup device according to claim 7, wherein both potential gradients of said gate means and said first horizontal shift register are preformed in a production process.

10. A charge input structure comprising:

signal input means for varying an amount of input charge in dependence on a signal level;

charge transfer means for receiving the charge from said signal input means and transferring it in a predetermined direction, said charge transfer means including a plurality of potentials each of which has a fixed gradient in said predetermined direction and a transfer electrode which controls part of the potentials; and gate means between said signal input means and said charge transfer means for controlling the charge shift from said signal input means to said charge transfer means, said gate means having a potential which has a fixed gradient opposite in inclination polarity to that of said charge transfer means and a gate electrode which controls the height of said potential.

11. A charge input structure according to claim 10, wherein said potential gradient is formed by ion implantation.

12. A charge input structure comprising:

signal input means for varying an amount of input charge independence on a signal level;

charge transfer means for receiving the charge from said signal input means and transferring it in a predetermined direction, said charge transfer means including a transferring variable potential part registered under a transfer electrode, the potential of which varies with a voltage applied to the transfer electrode, and a fixed potential part not registered under the transfer electrode, the potential of which does not vary with voltages applied to other transfer electrodes, at least said transferring variable potential part having a gradient in a predetermined direction; and gate means between said signal input means and said fixed potential part of said charge transfer means, said gate means including a gating variable potential part which has a predetermined relation with said transferring variable potential part and a gate electrode which controls the potential level of said gating variable potential part.

13. A charge input structure according to claim 12, wherein said signal input means include a diode.

14. A charge input structure according to claim 12, wherein said gating variable potential part has a gradient opposite in inclination polarity to that of said transferring variable potential part.

15. A charge input structure according to claim 14, wherein the degree of said gradient is dependent on voltages applied to said transfer and gate electrodes.

* * * * *

UNITED STATES PATENT AND TRADEMARK OFFICE

CERTIFICATE OF CORRECTION

PATENT NO. : 4,581,652

DATED : April 8, 1986

INVENTOR(S) : TAKAO KINOSHITA, ET AL.

It is certified that error appears in the above-identified patent and that said Letters Patent is hereby corrected as shown below:

Column 1, line 67, change "cross sectional" to --cross-sectional--.

Column 2, line 5, change "herein below" to --hereinbelow--; and line 23, change "an voltage" to --a voltage--.

Column 3, line 43, change "electorde" to --electrode--.

Column 4, line 43, change "I, II" and II'" to --I, I" and II'--; and line 57, change "above the" to --above, the--.

Column 7, line 1, change "and and (4,4)." to --and (4,4).--.

Column 8, line 67, change "a MOS" to --an MOS--.

Column 9, line 5, change "Althrough" to --Although--; and line 11, change "cross" to -- cross- --.

Column 10, line 40, change "both potential" to --both the potential--; and line 66, change "independence" to --in dependence--.

Signed and Sealed this

Eleventh Day of November, 1986

*Attest:*

DONALD J. QUIGG

*Attesting Officer* *Commissioner of Patents and Trademarks*